(12) United States Patent
Kondrus et al.

(10) Patent No.: US 12,171,069 B2
(45) Date of Patent: Dec. 17, 2024

(54) EXPLOSION-PROOF HOUSING AND METHOD FOR THE ASSEMBLY THEREOF

(71) Applicant: R. Stahl Schaltgeräte GmbH, Waldenburg (DE)

(72) Inventors: Elena Kondrus, Künzelsau (DE); Jürgen Schmitt, Öhringen (DE); Natascha Sekinger, Baierbach (DE); Otto Walch, Gerabronn (DE); Bernd Limbacher, Schwäbisch Hall (DE); Christian Kochendörfer, Schwäbisch Hall (DE)

(73) Assignee: R. Stahl Schaltgeräte GmbH, Waldenburg (DE)

(*) Notice: Subject to any disclaimer, the term of this patent is extended or adjusted under 35 U.S.C. 154(b) by 256 days.

(21) Appl. No.: 17/428,175

(22) PCT Filed: Jan. 24, 2020

(86) PCT No.: PCT/EP2020/051770
§ 371 (c)(1),
(2) Date: Aug. 3, 2021

(87) PCT Pub. No.: WO2020/160937
PCT Pub. Date: Aug. 13, 2020

(65) Prior Publication Data
US 2022/0201872 A1    Jun. 23, 2022

(30) Foreign Application Priority Data
Feb. 5, 2019   (DE) .................... 10 2019 102 832.9

(51) Int. Cl.
*H05K 5/00*   (2006.01)
(52) U.S. Cl.
CPC .................. *H05K 5/0008* (2013.01)

(58) Field of Classification Search
None
See application file for complete search history.

(56) References Cited

U.S. PATENT DOCUMENTS 2,774,621 A * 12/1956 Kilbourne, Jr. ......... F16L 23/22
277/649
3,974,933 A    8/1976 Toth et al.
(Continued)

FOREIGN PATENT DOCUMENTS

| | | |
|---|---|---|
| CN | 202712771 U | 1/2013 |
| DE | 112010005085 T5 | 11/2012 |

(Continued)

OTHER PUBLICATIONS

Kristin Breunig et al., "Flügeltüren für den Ex-Bereich", Jan. 22, 2019, Retrieved from the Internet: https://www.process.vogel.de/fluegeltueren-fuer-den-ex-bereich-a-792371/.

(Continued)

*Primary Examiner* — Krystal Robinson
(74) *Attorney, Agent, or Firm* — Blank Rome LLP

(57) ABSTRACT

An explosion-protected housing having a housing body, a frame part and at least two separate covers. The housing body delimits an interior space which is open at one side by means of a housing opening. The frame part has a circumferential web surrounding the housing opening. Extending within the circumferential web is a central web of the frame part that divides the housing opening into at least two opening portions. A cover abutment surface is formed, against which the covers bear in their closed position. An encirclingly closed flameproof gap is formed between each cover and the cover abutment surface when the cover is situated in the closed position and is detachably fastened by means of one or more connecting units to the frame part.

13 Claims, 9 Drawing Sheets

(56) References Cited

U.S. PATENT DOCUMENTS

| | | | |
|---|---|---|---|
| 4,180,177 A | 12/1979 | Gunderman et al. | |
| 6,657,861 B2* | 12/2003 | Irmer | H04Q 1/025 |
| | | | 312/265.5 |
| 6,877,827 B2* | 4/2005 | Holighaus | H02B 1/30 |
| | | | 312/213 |
| 6,879,483 B2* | 4/2005 | Johnson | H02B 1/28 |
| | | | 312/265.5 |
| 10,947,773 B2* | 3/2021 | Reese | E06B 7/22 |
| 11,160,182 B2* | 10/2021 | Bier | H05K 5/061 |
| 2002/0140325 A1* | 10/2002 | Webster | H02B 1/50 |
| | | | 312/223.1 |
| 2006/0102371 A1* | 5/2006 | Reynolds | H02G 3/086 |
| | | | 174/50 |
| 2010/0244641 A1* | 9/2010 | Bergesch | E05B 65/02 |
| | | | 292/195 |
| 2014/0001932 A1* | 1/2014 | Westby | H02B 3/00 |
| | | | 312/223.1 |
| 2015/0354249 A1 | 12/2015 | Manahan | |
| 2016/0255421 A1* | 9/2016 | Farrar | H05K 5/0217 |
| | | | 340/870.07 |
| 2018/0135350 A1* | 5/2018 | Reese | H05K 5/0226 |

FOREIGN PATENT DOCUMENTS

| | | |
|---|---|---|
| EP | 1107656 A2 | 6/2001 |
| SU | 1097211 A | 6/1984 |
| WO | WO 2013/165561 A1 | 11/2013 |

OTHER PUBLICATIONS

R. Stahl. "EXpressure—Double wing door cabinets in Ex d", Jan. 16, 2019, Retrieved from the Internet: https//r-stahl.com/en/global/product-news/expressure-double-wing-door-cabinets-in-ex-d-by-r-stahl/.

Alex Delvalle, "Atex Enclosure Ex Tribex Series", Feb. 12, 2016, Retrieved from the Internet: https://www.atexdelvalle.com/catalogos/Tribex_IP66_Delvalle_EN_v1.0-16.pdf.

* cited by examiner

EXPLOSION-PROOF HOUSING AND METHOD FOR THE ASSEMBLY THEREOF

CROSS REFERENCE TO RELATED APPLICATIONS

This application is a national phase of PCT/EP2020/051770, filed Jan. 24, 2020, which claims priority to German Application No. 10 2019 102 832.9, filed Feb. 5, 2019, the subject matter of each of which are incorporated by reference herein in their entirety.

BACKGROUND

The invention refers to an explosion-proof housing as well as a method for explosion-proof arrangement of at least one electrical and/or electronic device in the explosion-proof hosing.

In explosive atmospheres explosion-proof housings serve to arrange ignition sources that could ignite the explosive atmosphere in a protected manner in the interior of an explosion-proof housing. For example, an electrical and/or electronic device can serve as ignition source. Such a device can also be operated safely in the interior of the explosion-proof housing also in an explosive area.

Such explosion-proof housings are known. For example, DE 11 2010 005 085 T5 describes an explosion-proof housing with a housing body and a cover, wherein a housing opening is provided at the housing body. Adjacent to the housing opening a housing flange is provided on the housing body. The cover of the explosion-proof housing can be placed on the housing flange. A clamping connection can be established between the cover and the housing flange by means of a clamping device.

EP 1 107 656 A2 describes an explosion-proof housing in the ignition protection category "flameproof enclosure (Ex-d)". The housing comprises a housing body having a housing opening. A cover of the explosion-proof housing can be placed on an abutment surface that surrounds the housing opening. A clamping connection between the cover and the housing body can be established by means of a clamp.

The explosion-proof housing known from U.S. Pat. No. 4,180,177 A comprises a housing opening that can be closed by means of a pivotable cover. In the closed condition of the cover it is secured on the housing body by means of screws in order to seal the interior of the explosion-proof housing in a flameproof manner against the environment.

An explosion-proof and waterproof housing is described in U.S. Pat. No. 3,974,933 A. A housing body has a housing opening that is surrounded by an external thread. A cover having an inner thread can be screwed on the outer thread of the housing body in order to close the housing opening. A seal can be provided between the cover and the housing body. The cover can be secured on the housing body by means of an additional securing device.

If the cover of an explosion-proof housing is in a closing position, it is necessary that the remaining gaps between the cover and the housing body guarantee that no ignition sparks, hot gases, flames or the like escape from the interior of the housing and could lead to an ignition of the surrounding explosive atmosphere. The housing opening is usually relatively wide in order to allow the arrangement of the electrical and/or electronic device in the interior through the housing opening. This in turn results in that a cover closing the housing opening that has to withstand the explosion pressure in the interior of the housing can be large and heavy. Thus, the handling of the cover during the assembly of the electrical and/or electronic device or other devices in the housing becomes difficult. For example, complex hinges are necessary for pivotable covers that have to support the large and heavy cover and have to guarantee a sufficient pivot range in order to allow the access to the interior of the housing through the housing opening, if the cover is in the open position. The weight and the handling of the cover can become complicated depending on the configuration of the housing, if installations and/or operating elements for operating the electrical and/or electronic device are provided in the cover. Such installations or operating elements can be indication devices, switches, buttons, touch-sensitive areas or displays or the like.

BRIEF SUMMARY

Starting from the known prior art, it can be considered as object of the present invention to provide an explosion-proof housing that improves the assembly of an electrical and/or electronic device in the interior of the explosion-proof housing.

This object is solved by an explosion-proof housing having the features of claim 1 as well as a method having the features of claim 13.

The explosion-proof housing has a housing body that limits an interior. For this the housing body comprises multiple housing walls. On one side the housing body has a housing opening. The access to the interior is possible through the housing opening. One or more ignition sources, particularly at least one electrical and/or electronic device can be arranged in the interior. By means of the explosion-proof housing the at least one ignition source can be separated from an explosive atmosphere in the environment.

In addition, the explosion-proof housing has a frame part. The frame part is attached to the housing body. Preferably the frame part is releasably attached to the housing body such that a flameproof gap is formed between the frame part and the housing body. The frame part has a peripheral web that surrounds the housing opening. The peripheral web is completely closed in a circumferential direction around the housing opening. In addition, the frame part has a central web that extends within the peripheral web. The at least one central web separates the housing opening in two or more opening sections. The number of opening sections depends on the number and/or the arrangement of the central webs. In a preferred embodiment only one single central web is provided, for example. The at least one central web can be positioned in that the two opening sections formed thereby have the same size.

At least two separate covers are part of the explosion-proof housing. The covers can be handled individually from one another and can be moved separately between a closing position and an open position respectively, for example. If all covers are in the closing position, the housing opening is closed by means of the covers. If at least one of the covers is in an open position, at least the respective part, e.g. one opening section of the housing opening, is accessible. In the closing position each cover abuts against a section of the peripheral web respectively and against at least one of the provided central webs. In the closing position a flameproof gap is formed between each cover and the frame part, that is the respective section of the peripheral web and the at least one central web. Therefore, it is not necessary that a flameproof gap is formed between two adjacent covers that are in the closing position respectively. Each cover is individually arranged on the housing body forming a flameproof gap in each case. The flameproof gap between the respective cover and the frame part is completely closed with view in circumferential direction around the cover. If all of the covers are in the closing position, the interior of the explosion-proof housing is separated or sealed against the explosive atmosphere in the environment in a flameproof manner.

The explosion-proof housing is particularly configured in the ignition protection category flameproof enclosure (Ex-d) according to one of the standards EN 60079-1 or IIC 60079-1.

It is preferred, if at least two of the provided covers abut against each central web, if the covers are in the respective closing position. In doing so, adjacent opening sections that are separated from one another by the respective central web are closed in a flameproof manner in that the directly adjacent covers abut against the central web.

In a preferred embodiment the frame part is integrally formed and preferably comprises no seam or joint. As an alternative, the frame part can be manufactured from multiple sections, e.g. multiple webs, that are immovably connected with one another, particularly in a substance bond manner or by an adhesive bond, e.g. by welding or gluing.

It is advantageous that the housing body comprises a housing flange. The housing flange surrounds the housing opening, preferably completely. The peripheral web can be in abutment with the housing flange such that particularly in the condition where the covers are in the closing position a flameproof gap is formed between the peripheral web and the housing flange. The flameproof gap is completely closed in circumferential direction around the housing opening.

The thickness of the at least one central web can be larger than the thickness of the peripheral web of the frame part. In doing so, it is possible to integrate connection means at least partly in the at least one central web.

It is advantageous that the frame part is releasably attached to the housing body by means of a connection arrangement. In addition or as an alternative, the covers can be releasably attached to the frame part and/or the housing body by means of the same or another connection arrangement. Preferably one single connection arrangement with multiple separate connection units is provided, at least some of which are configured for releasable attachment of the frame part to the housing body, as well as for releasable attachment of the covers to the frame part or to the housing body. Connection units that only serve to connect the frame part to the housing body can be omitted. In doing so, during attachment of the covers the frame part can be concurrently attached to the housing body with one unitary connection arrangement such that a connected arrangement of covers, the frame part and the housing body is formed by using the connection arrangement. In doing so, the assembly can be further simplified.

The connection arrangement can comprise multiple separate connection units. Preferably each connection unit has a first connection part and a second connection cooperating with the first connection part. For example, the second connection part of each connection unit can be immovably connected with the housing body or the frame part and particularly the central web of the frame part. In an embodiment the second connection part can be an integral component of the housing body or the frame part and particularly the central web. As an alternative, the second connection part can be connected with the housing body or the frame part by a respective joint or attachment method, e.g. by welding, gluing, the establishment of a press-fit or the like.

It is advantageous that the first connection part has an external thread and if the second connection part has an internal thread. Vice versa also the first connection part could be an internal thread part and the second connection part could be an external thread part. By means of the thread a simple and quick connection suitable for explosion protection can be established.

One or more connection units can be configured as a clamping unit respectively that are configured for creation of a clamping connection. In this arrangement a clamping connection can be established by means of the connection unit that particularly creates only a force-fit and preferably no form-fit connection.

It is possible that the connection units are configured differently from one another. For example, one or more connection units can be configured as clamping unit, whereas other connection units are configured as screwing connection unit having an external thread part and an internal thread part. It is not necessary that all of the connection units of the connection arrangement are configured identically.

The assembly of the at least one electrical and/or electronic device in the explosion-proof housing is explained in the following:

First, the housing body is provided that limits the interior and comprises a housing opening. In doing so, the housing body can be manufactured from multiple housing walls that are connected with one another, e.g. by welding or gluing. In addition, a frame part having a peripheral web and at least one central web is provided that extends within the peripheral web. Also at least two separate covers are provided. Preferably the number of covers corresponds to the number of openings in the frame part that are separated by the one or the multiple central webs.

The at least one electrical and/or electronic device can be arranged in the interior via the housing opening. Only subsequently the frame part and the covers are attached to the housing body, preferably by use of the same connection arrangement. Thereby the frame part is arranged in a manner such that the housing opening is separated into multiple opening sections. In doing so, the covers can also abut against one or more central webs and can have a smaller size. Between the frame part and the housing body and particularly between the peripheral web and the housing body, a flameproof gap is formed during establishment of the connection. In addition, the connection between the covers and the frame part is configured such that one flameproof gap is formed between each cover and the frame part. In this manner the interior of the explosion-proof housing is separated from the environment in which an explosive atmosphere may be present by creation of the flameproof condition.

BRIEF DESCRIPTION OF THE DRAWINGS

Advantageous embodiments of the invention are derived from the dependent claims, the description and the drawings. In the following, preferred embodiments of the invention are explained in detail with reference to the attached drawings. The drawings show:

DETAILED DESCRIPTION

Figure 1:
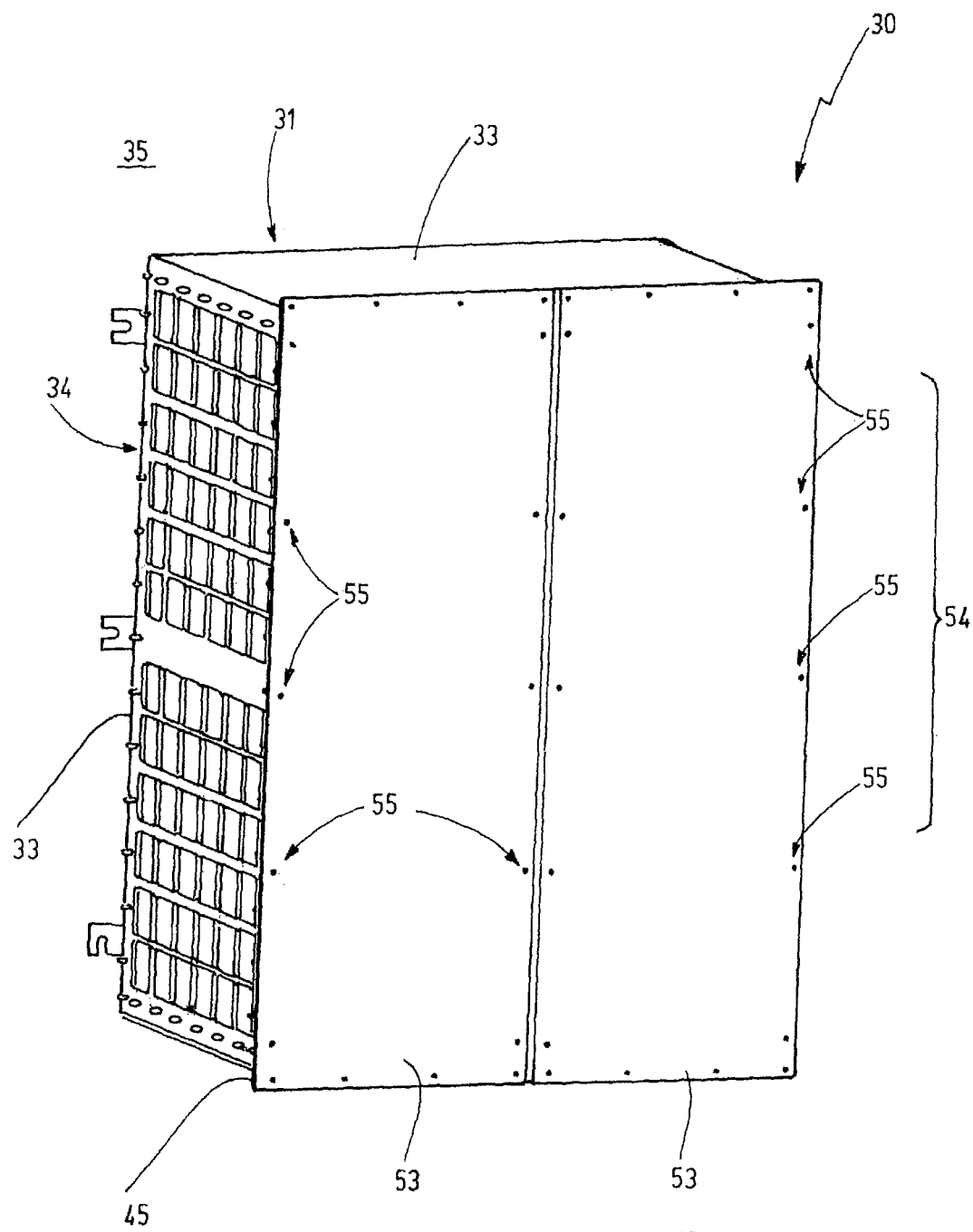
FIG. 1 a perspective view of an embodiment of an explosion-proof housing.
Figure 2:
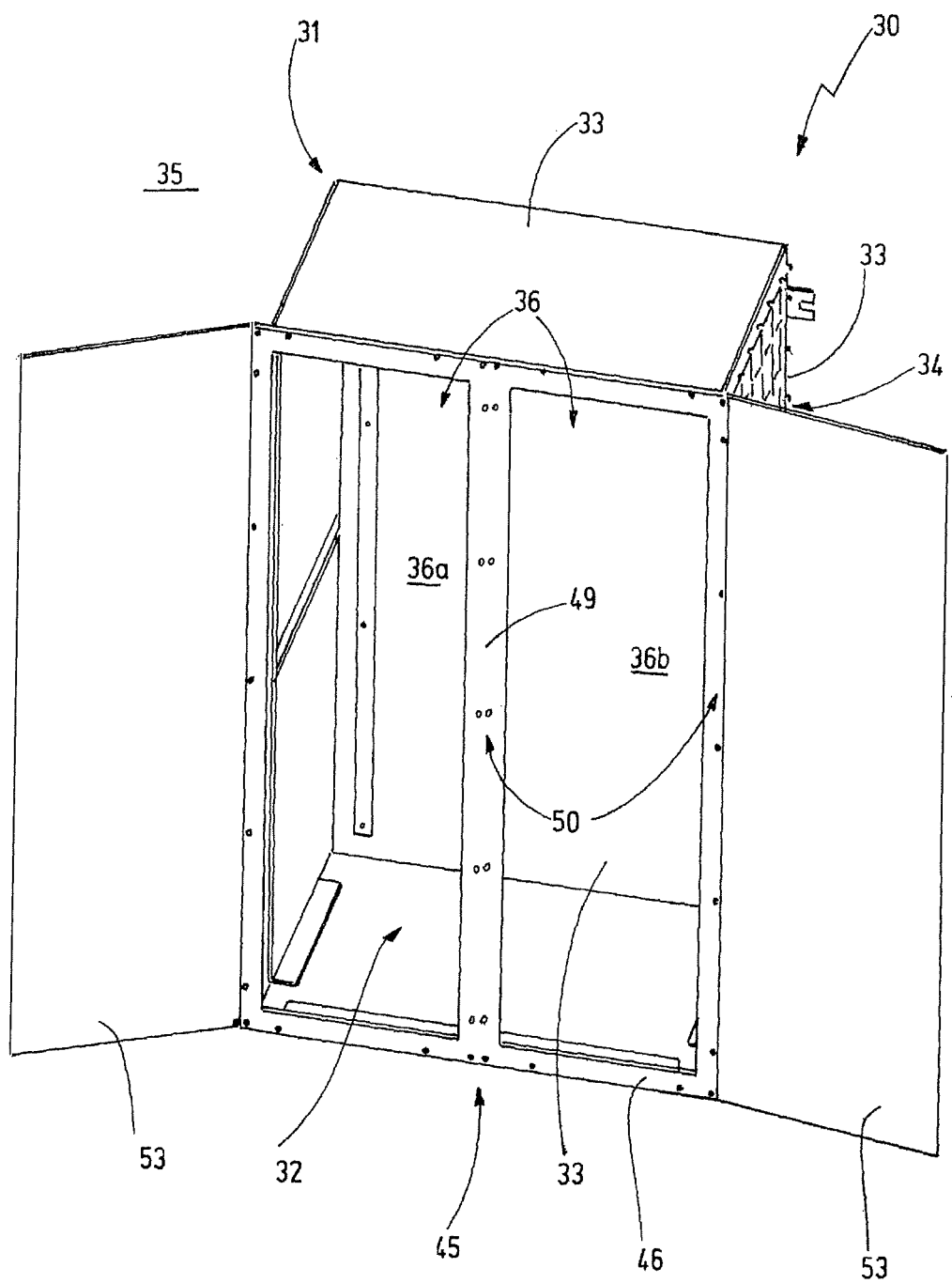
FIG. 2 a perspective view of another embodiment of an explosion-proof housing.

In FIGS. 1 and 2 a perspective illustration of an embodiment of an explosion-proof housing 30 is shown respectively. The explosion-proof housing 30 has a housing body 31 that limits an interior 32. For this the housing body 31 comprises multiple housing walls 33 that are connected with each other, e.g. by means of a screw connection and/or a glue connection and/or a welded connection or another suitable connection type that withstands a potential explosion pressure in the interior 32 and does not allow ignitable gases, flames, sparks or the like to escape from the interior 32. For example, the housing body 31 can comprise five housing walls 33 that limit an interior 32 having a cuboid-shaped contour.

In modification to the illustrated embodiment, the housing body 31 can also be hollow cylindrical or can comprise a polygonal cross-sectional contour. The form of the housing body 31 is in principle arbitrarily selectable.

A pressure-relief device 34 can be arranged in one or more housing walls 33 in order to provide a gas flow channel between the interior 32 and the environment 35 outside of the explosion-proof housing 30. The at least one gas flow channel of the pressure-relief device 34 is configured such that no gases, sparks or flames having the ability to ignite can escape from the interior 32 into the environment 35. Due to the pressure-relief device 34, the maximum explosion pressure that may occur in the case of an explosion inside the interior 32 is reduced such that a respective lower strength of the explosion-proof housing 30 is sufficient in order to withstand the maximum possible explosion pressure in the interior 32. In doing so, the explosion-proof housing 30 can be configured simpler and less heavy.

The housing body 31 comprises a housing opening 36. The interior 32 is accessible via the housing opening 36, e.g. in order to arranged at least one electrical and/or electronic device 37 (FIG. 3) that could serve as ignition source for the explosive atmosphere in the environment 35 in the interior 32 of the housing body 31 or the explosion-proof housing 30.

In the embodiment described here the housing opening 36 of the housing body 31 is surrounded by a housing flange 38 that is completely closed in circumferential direction around the housing opening 36. A housing abutment surface 39 is provided on the housing flange 38 that faces away from the housing body 31. Preferably the housing abutment surface 39 extends in one single plane. In a modified embodiment the housing abutment surface 39 can also be formed by the faces of the housing walls 33 surrounding the housing opening 36. Dependent from the thickness or strength of the housing walls 33, the housing flange 38 can also be omitted as an option, if the wall thickness of the housing walls 33 is sufficiently large.

A frame part 45 is also part of the explosion-proof housing 30. The frame part 45 comprises a peripheral web 46 on which a frame abutment surface 47 is formed. The frame abutment surface 47 extends preferably in one single plane. The frame abutment surface 47 is configured to get in contact with the housing abutment surface 39. A frame inner space 48 of the frame part 45 surrounded by the peripheral web 46 has preferably the same shape and the same dimension as the housing opening 36 of the housing body 31.

The frame part 45 also comprises at least one central web 49 that passes through the frame inner space 48 and separates the frame inner space 48 in two or more space sections. In the embodiment of the frame part 45 shown in FIG. 4 one single central web 49 is provided that separates the frame inner space 48 in a first space section 48a and a second space section 48b. The at least one central web 49 is preferably connected with the peripheral web 46 at its two ends respectively. The at least one central web 49 extends preferably linearly.

Figure 4:
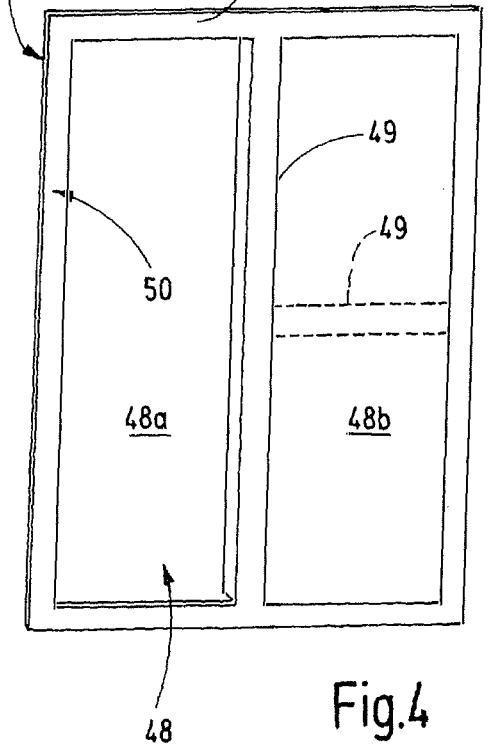

In addition, a modified embodiment is schematically illustrated in FIG. 4 in which an additional central web 49 is provided that extends from the peripheral web 46 up to the other provided central web 49. The number of the central webs 49 can also be larger than two, depending on the size of the housing opening 36.

Figure 5:
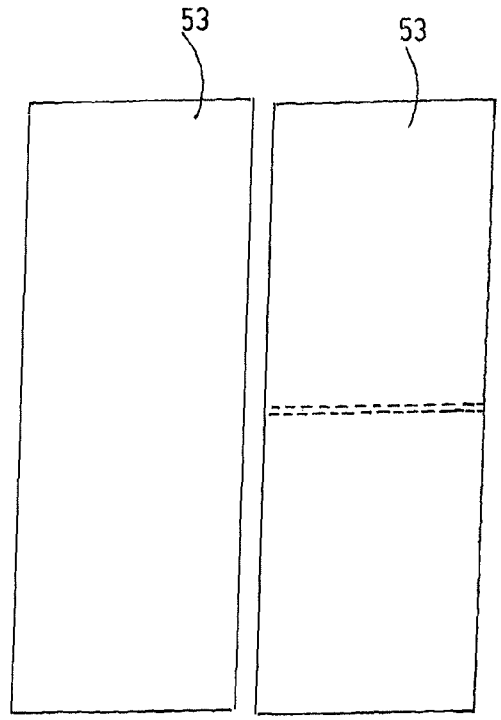

The explosion-proof housing 30 also has at least two covers 53 (FIG. 5). The covers 53 are configured to completely cover the housing opening 36 in a closing position of the covers 53. In the embodiment the number and the size of the covers 53 correspond to the number and the size of the space sections 48a, 48b of the frame inner space 48. In the embodiment having one single central web 49 two covers 53 are provided. If two or more central webs 49 or space sections are provided, the number of covers 53 increases accordingly.

Figure 3:
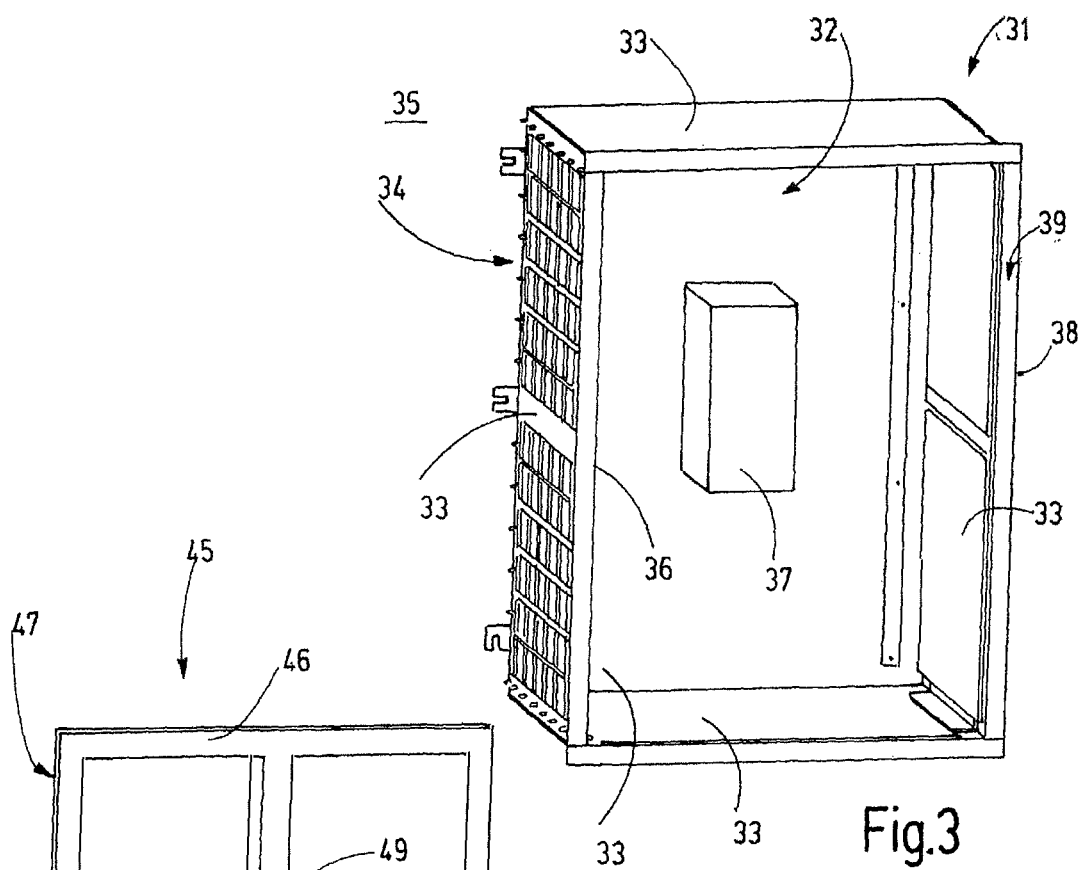
FIG. 3 an embodiment of a housing body of an explosion-proof housing in a perspective view, FIG. 4 an embodiment of a frame part of an explosion-proof housing in a perspective view, FIG. 5 an embodiment of covers of an explosion-proof housing in a perspective view, FIG. 6 a side view on the shorter side of the frame part of FIG. 4, FIG. 7 a side view on a shorter side of a frame part according to another embodiment, FIG. 8 an enlarged sectional illustration of the frame part of FIGS. 4 and 6, FIGS. 9 to 19 sectional illustrations respectively for illustration of different embodiments of a connection unit of a connection arrangement for releasable connection of the covers, the frame part and the housing body of an explosion-proof housing.

The covers 53 are configured as separate components and are not directly connected with one another and are not movably coupled. Each cover 53 can be moved independently from the one or more additional covers 53 between a closing position and an open position. In the explosion-proof housing 30 of FIGS. 1 and 2 the covers 53 are in their respective closing position in the illustration in FIG. 1, whereas they are in their respective open position in FIG. 2. The covers 53 can be attached to the housing body 31 and/or the frame part 45 by means of hinges or joints and can be pivoted between the closing position and the open position. It is also possible to configure the covers 53 as completely separately handable components (FIGS. 3-5).

The covers 53, the frame part 45 and the housing body 31 are releasably connected with one another at least in the closing position of the covers 53 by means of a connection arrangement 54 that comprises multiple connection units 55. In FIG. 1 only screw heads or screw nuts of a respective screw connection of each connection unit 55 can be seen. The releasable connection can be effected by means of a form-fit and/or force-fit connection by means of the respective connection unit 55.

In the assembled condition a frame abutment surface 47 abuts against the housing abutment surface 39 and is pressed against the housing abutment surface 39 by means of the connection arrangement 54. Thus, a first flameproof gap 56 is created between the housing abutment surface 39 and the frame abutment surface 47 (FIGS. 9, 12, 14, 16, 18). In the embodiment also the covers 53 are attached to the frame part 45 by means of the connection units 55 of the connection arrangement 54 such that the covers 53 abut with a peripheral section against a cover abutment surface 50 of the frame part 45. The cover abutment surface 50 is formed on the side of the frame part 45 opposite the frame abutment surface 47 and preferably extends in one single plane. The cover abutment surface 50 is formed by the peripheral web 46 as well as the at least one central web 49. Between the cover 53 and the cover abutment surface 50 of the frame part 45 a second flameproof gap 57 is formed, if the connection is established by means of the connection arrangement 54.

As an option, the flameproof gaps 56, 57 can be protected by seals according to an IP protection class against the ingress of dust and/or water in the interior 32. The flameproof gaps 56, 57 are—independent from an optional seal—dimensioned with regard to the flow path between the interior 32 and the environment 35 such that hot gases are sufficiently cooled or sparks or flames are extinguished before they reach the environment 35 having the explosive atmosphere on the way from the interior 32 to the outside. In this manner the flameproof condition is achieved. The configuration of the flameproof gaps 56, 57 correspond to one or more defined standards. Preferably the explosion-proof housing 30 is configured in the ignition protection category "flameproof enclosure" (Ex-d) according to one of the standards EN 60079-1 or IIC 60079-1.

In modification to the embodiment that is illustrated here, it is also possible to use another connection arrangement for connection of the frame part 45 with the housing body 31 than for the attachment of the covers 53 to the frame part 45. In the embodiments illustrated here, each connection unit 55 of the connection arrangement 54 is configured to releasably connect three components with one another respectively, namely one cover 53, the frame part 45 and the housing body 31. Different possibilities of configuration for the connection units 55 are shown in FIGS. 9-19. Thereby it is also possible that connection units 55 of one connection arrangement 54 are configured different from one another or do not operate according to identical principles for establishment of the connection. For example, one connection unit 55 can establish a screw connection, whereas another connection unit 55 of the same connection arrangement 54 can establish a clamping connection. In the embodiments illustrated here it is in addition provided that the connection units 55 that are assigned to the at least one central web 49 differ in terms of their configuration from the connection units 55 that are assigned to the peripheral web 46 or the housing flange 38.

If the connection of the frame part 45 with the housing body 31 is established, the at least one central web 49 separates the housing opening 36 in at least two opening sections and according to the example, a first opening section 36a and a second opening section 36b (FIG. 2). The first opening section 36a is formed by the first space section 48a of the frame inner space 48 and the second opening section 36b is formed by the second space section 48b of the frame inner space so-to-speak. In the closing position of the covers 53, each cover 53 covers an assigned opening section 36a, 36b. In the illustrated embodiment the cover 53 abuts in the closing position against a section of the peripheral web 46 as well as the central web 49. In other embodiments a cover 53 can also abut only against multiple central webs 49 depending on the number and the arrangement of the central webs 49.

For establishing the flameproof gaps 56, 57 and for a connection of the covers 53 with a frame part 45 and the housing body 31, the explosion-proof housing 30 comprises the connection arrangement 54 with multiple connection units 55 as explained above. In FIGS. 9-19 different embodiments are illustrated that are able to establish a form-fit and/or force-fit and releasable connection. According to the example, each connection unit 55 has a first connection part 61 and a second connection part 62. The two connection parts 61, 62 cooperate for creation of the form-fit and/or force-fit connection. The second connection part 62 can be arranged immovably on the housing body 31 or on the frame part 45. In the embodiments illustrated here the second connection part 62 can be immovably arranged on the central web 49 of the frame part 45.

Figure 9:
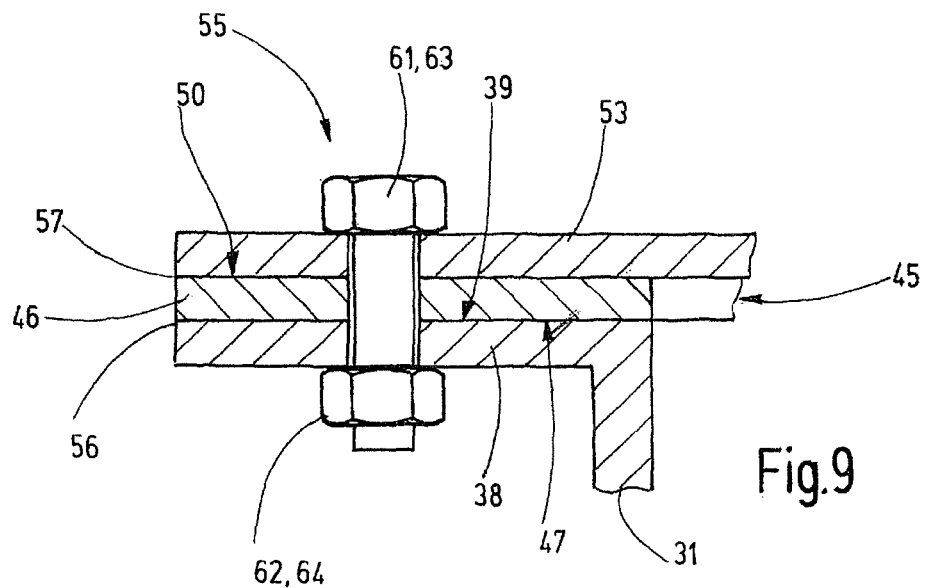
Figure 10:
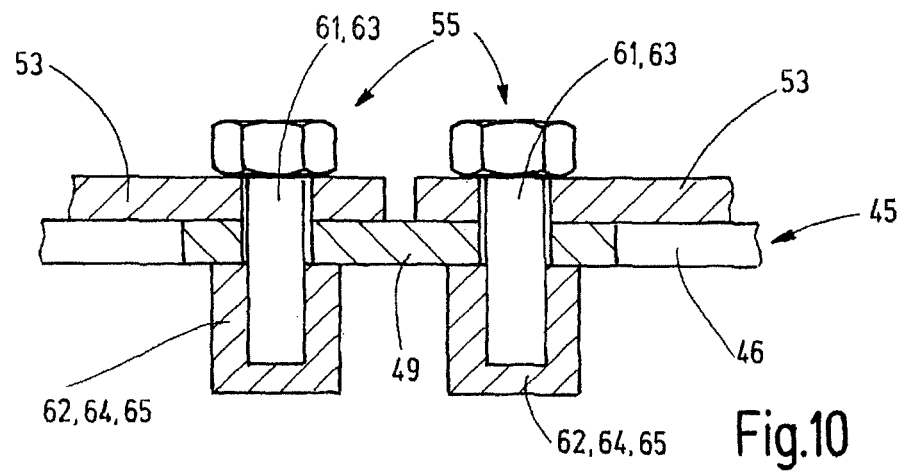
Figure 11:
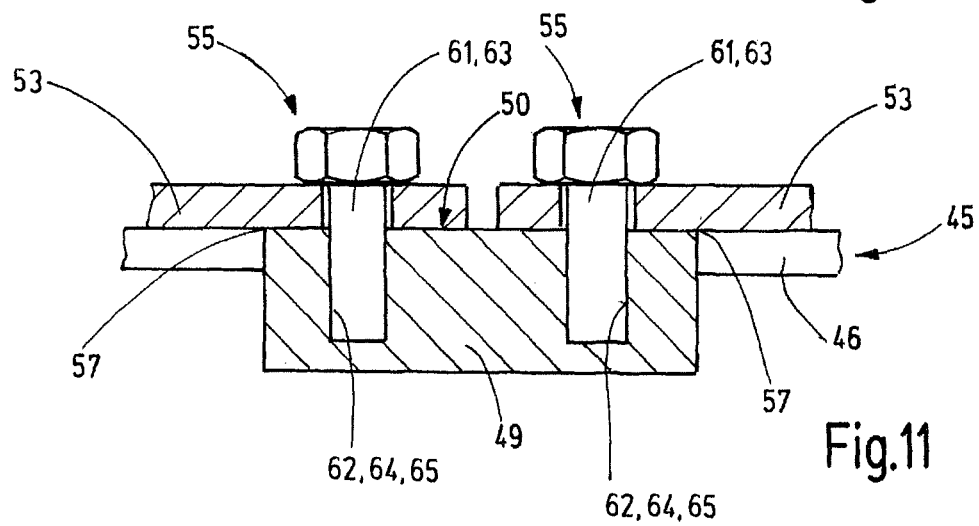

Embodiments of the connection units 55 are shown in FIGS. 9-11 in which the first connection part 61 is formed by an external thread part 63 and the second connection part 62 is formed by an internal thread part 64. The external thread part 63 can be a screw with a screw head and the internal thread part 64 can be a nut, for example (FIG. 9). For creation of this connection aligned through-holes can be provided in the housing flange 38, the peripheral web 46 and the edge region of the respective cover 53.

Figure 7:
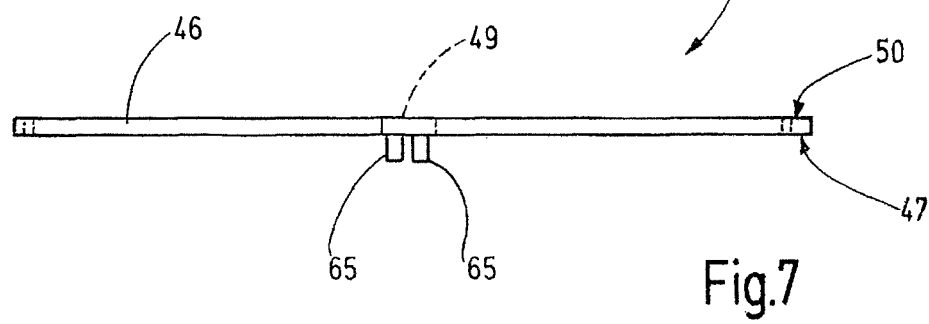
Figure 8:
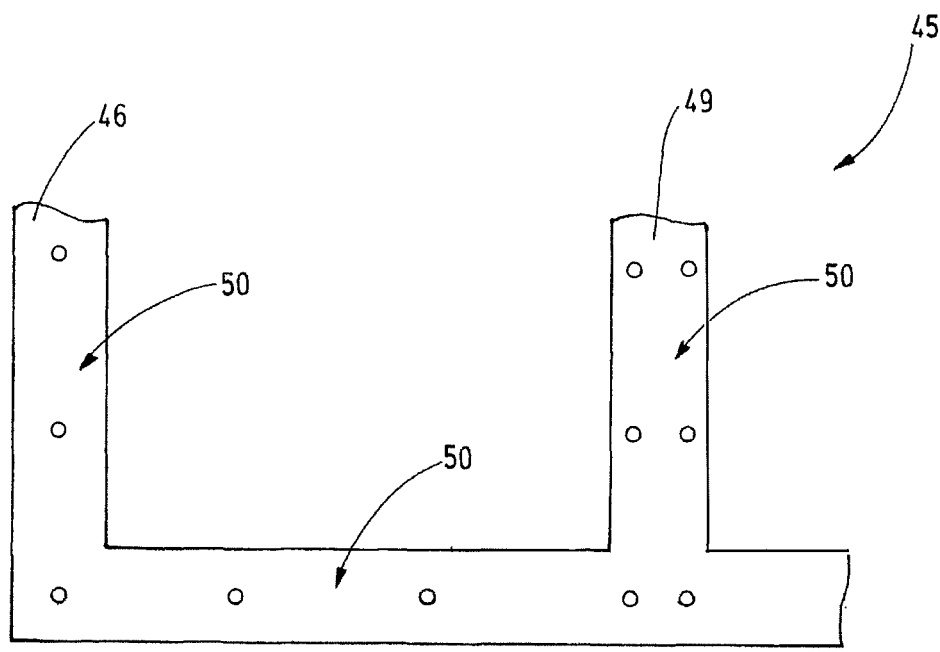

In case of a screw connection, the second connection part 62 can also be immovably connected with the central web 49. For example, internal thread bushings 65 can be provided in or can be attached to the central web 49. The connection of the thread bushings with the central web 49 can be established by welding, gluing or another suitable connection (FIGS. 1 and 7). This configuration is appropriate, if the thickness of the central web 49 is insufficient for introducing a thread of sufficient length. In this embodiment the peripheral web 46 and the at least one central web 49 can have the same thickness. The thickness is measured orthogonal to the frame abutment surface 47 or the cover abutment surface 50.

Figure 6:
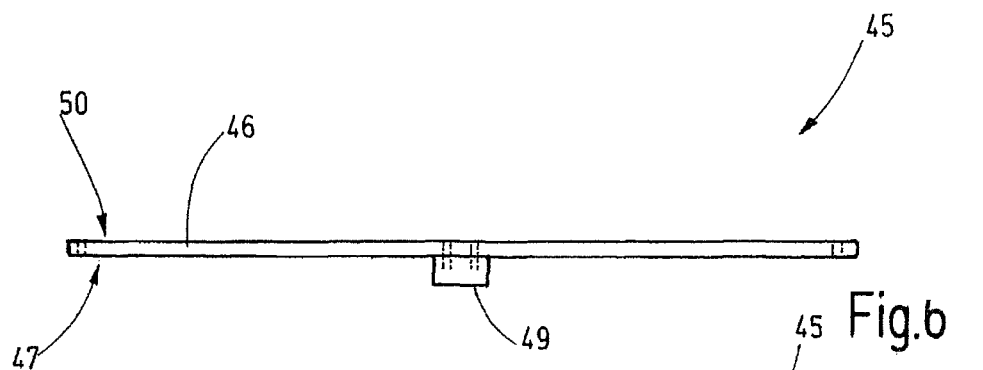

In the embodiment shown in FIGS. 6 and 11 the central web 49 has a thickness that is larger than the thickness of the peripheral web 46 and is sufficient for forming the inner thread directly in the central web 49. The second connection part 62 or the internal thread part 64 or the thread bushing 65 are thus integral part of the central web 49.

Instead of a screw connection, a respective connection unit 55 can also establish a clamping connection and thus a preferably exclusively force-fit connection. The connection unit 55 can form a clamping unit 66 that is configured for creation of a clamping force. Different embodiments are illustrated in FIGS. 12-19.

Figure 12:
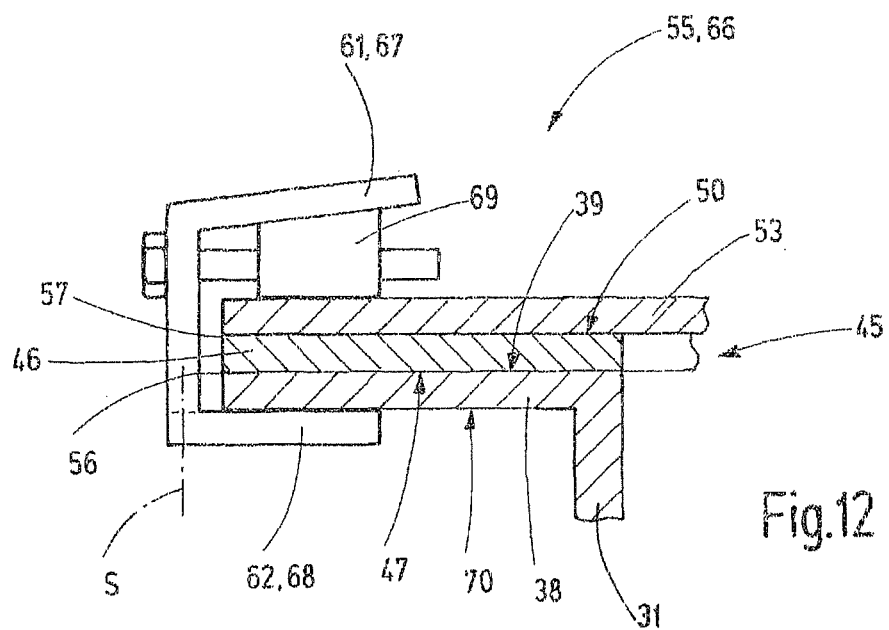

In the embodiment according to FIG. 12, the connection unit 55 or clamping unit 66 comprise a clamping bracket having a first clamping leg 67 and a second clamping leg 68 that are arranged with distance opposite to one another. The first clamping leg 67 forms the first connection part 61 and the second clamping leg 68 forms the second connection part 62. The first clamping leg 67 extends obliquely with regard to the second clamping leg 68 such that the inner area of the clamping bracket extends toward the free end of the first clamping leg 67. A wedge body is in contact with the first clamping leg 67 that is also configured to be supported on the cover 53. By means of an operation device the wedge body 69 can be moved parallel to the second clamping leg 68. In that the inner area of the clamping bracket tapers toward the inside or expands toward the outside, a clamping effect between the clamping legs 67, 68 can be created by movement of the wedge body 69. If the connection is established, the wedge body 69 is supported with the side facing the second clamping leg 68 on the cover 53 and the second clamping leg 68 is supported on the housing flange 38 on the flange lower side 70 that is opposed to the housing abutment surface 39. The stacked arrangement of the housing flange 38, the peripheral web 46 and the cover 53 can thus be pressed in a force-fit manner against one another in order to maintain the flameproof gaps 56, 57, if the connection is established.

The embodiment of the clamping unit 66 described above and shown in FIG. 12 can be modified in the area of the central web 49. There the second clamping leg 68 or the second connection part 62 is formed by the central web 49 itself. Apart therefrom the embodiment corresponds to the embodiment of FIG. 12.

Figure 13:
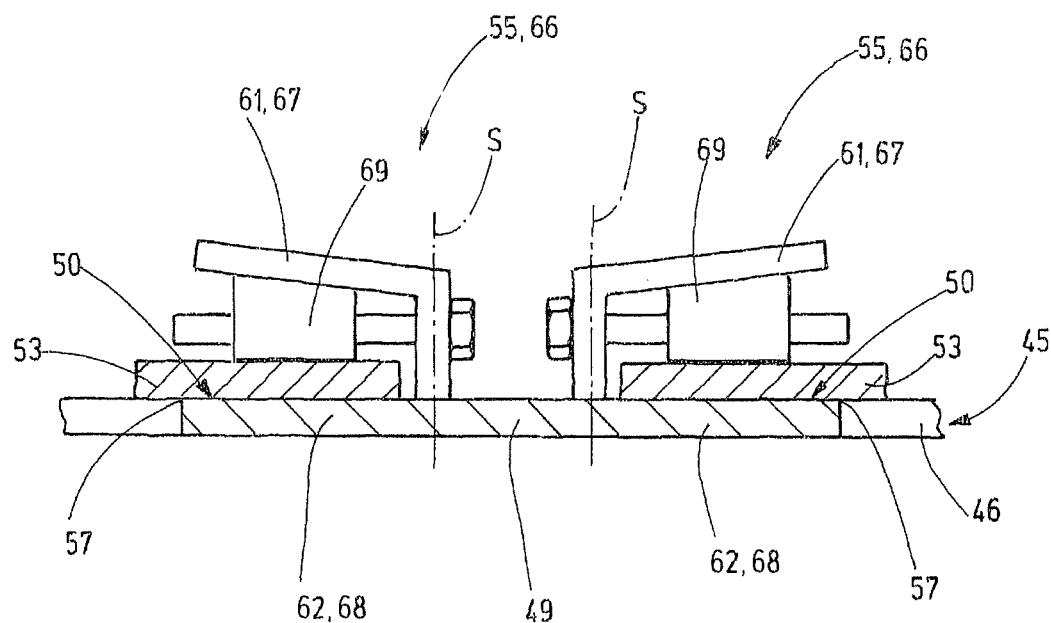

As it is also schematically illustrated in FIGS. 12 and 13, the first clamping leg 67 can be pivotably supported on the second clamping leg 68 and can be pivoted around the pivot axis S. For example, a pivot pin can project from the second clamping leg 68 for this purpose on which the first clamping leg 67 is preferably indirectly supported by means of a connection leg of the clamping bracket. The movement of the first clamping leg 67 parallel to the pivot axis S with reference to the second clamping leg 68 has to be blocked in this arrangement by means of a respective safety mechanism, because otherwise no clamping force can be created.

Figure 14:
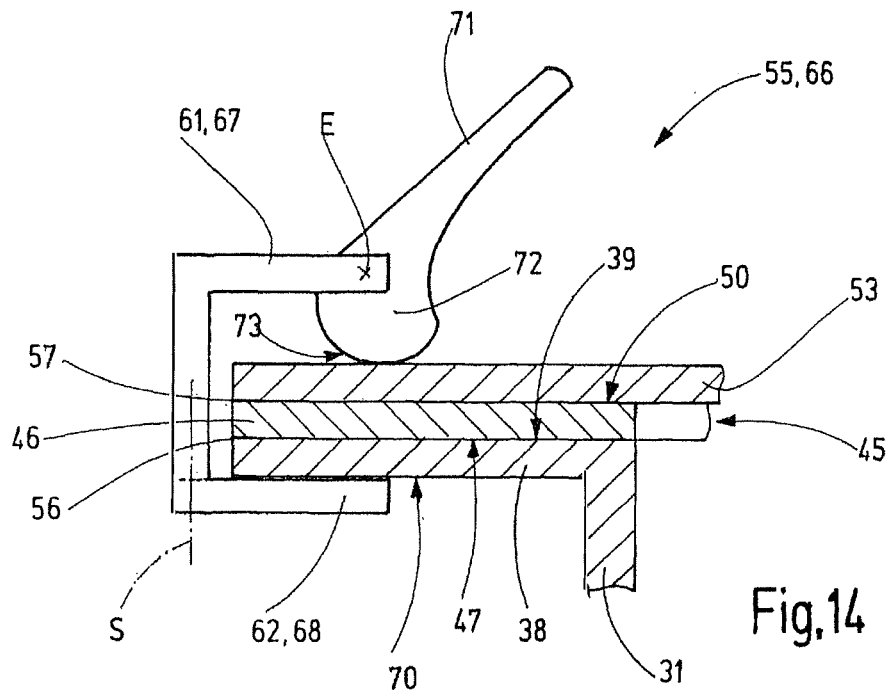

Compared with FIG. 12, FIG. 14 shows a modified embodiment of a connection unit 55 or a clamping unit 66 that also creates a clamping force. Instead of a wedge body 69, an eccentric clamping means is provided in order to create the clamping effect or the clamping force between the clamping legs 67, 68. In this configuration of the clamping bracket the two clamping legs 67, 68 can extend approximately parallel with one another. In this embodiment the eccentric clamping means has an eccentric clamping lever 71 that is pivotably supported around an eccentric axis E on the first clamping leg 67 and an eccentric cam 72 that comprises a cam surface 73. During pivoting of the eccentric clamping lever 71 around the eccentric axis E the cam surface 73 can get in contact with the cover 53 and can create a clamping effect between the two clamping legs 67, 68 due to the changing distance of the cam surface 73 to the eccentric axis E. Thus, a clamping force or pressing force is created between the cover 53, the peripheral web 46 and the housing flange 38 between the cam surface 73 and the second clamping leg 68. The clamping force is effected due to an elastic tensioning of the clamping bracket or the two clamping legs 67, 68 with regard to one another.

The embodiment of the clamping unit 66 shown in FIG. 14 and described above can be modified in the area of the at least one central web 49 such that the second clamping leg 68 is formed by the central web 49. The first clamping leg 67 is thereby attached to the central web 49 of the frame part 45.

Figure 15:
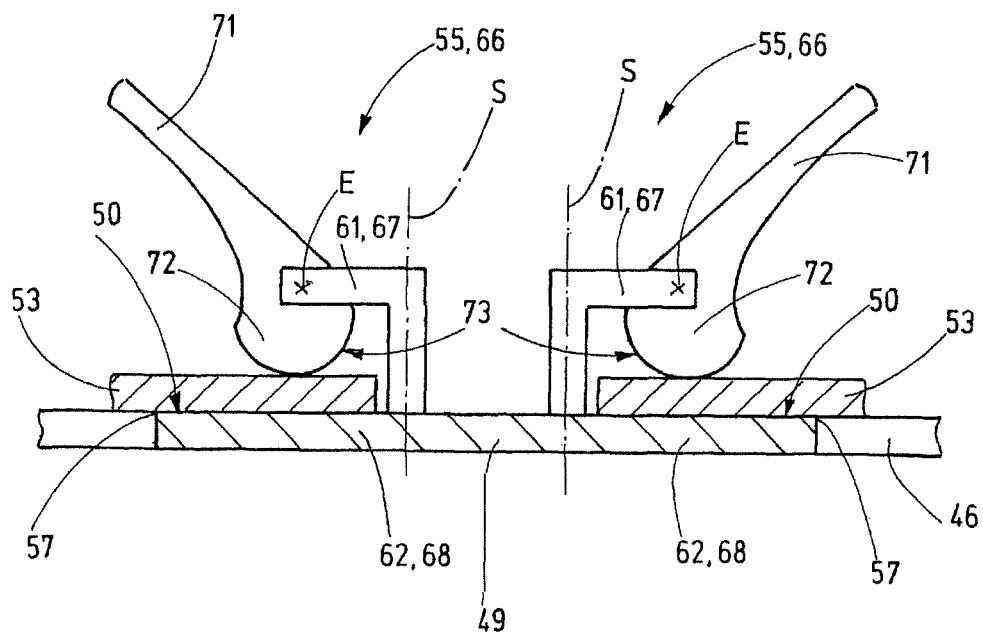

Analog to the embodiments according to FIGS. 12 and 13, also in the embodiments of FIGS. 14 and 15 the first clamping leg 67 can be pivotably supported relative to the second clamping leg 68 or the central web 49 around a pivot axis S. The pivot axis S extends orthogonal to the cover abutment surface 50 or to the frame abutment surface 47 or to the housing abutment surface 39.

Figure 16:
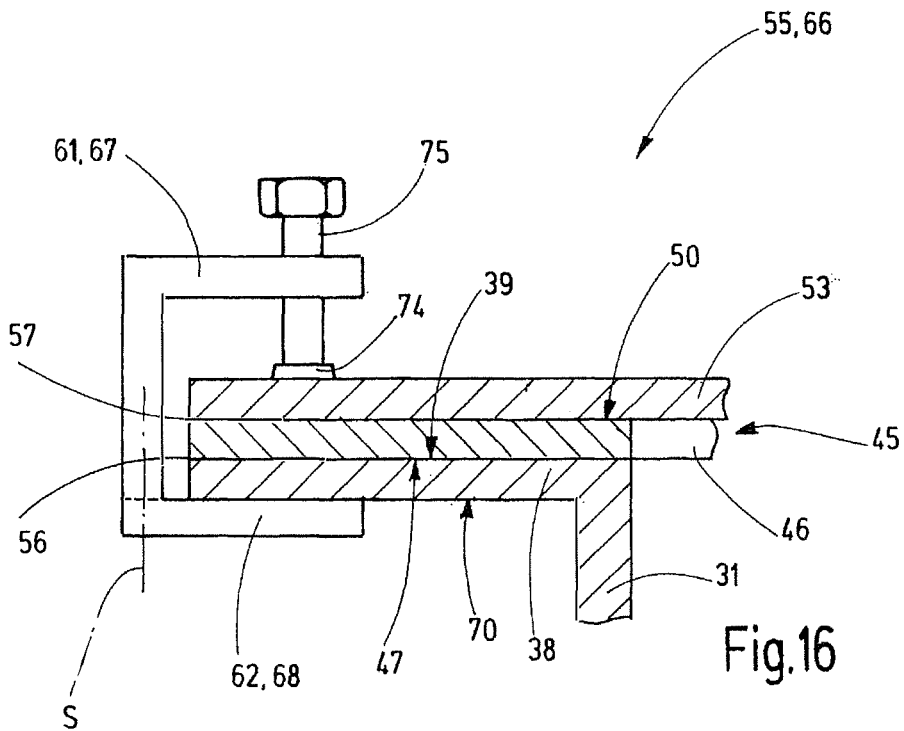
Figure 17:
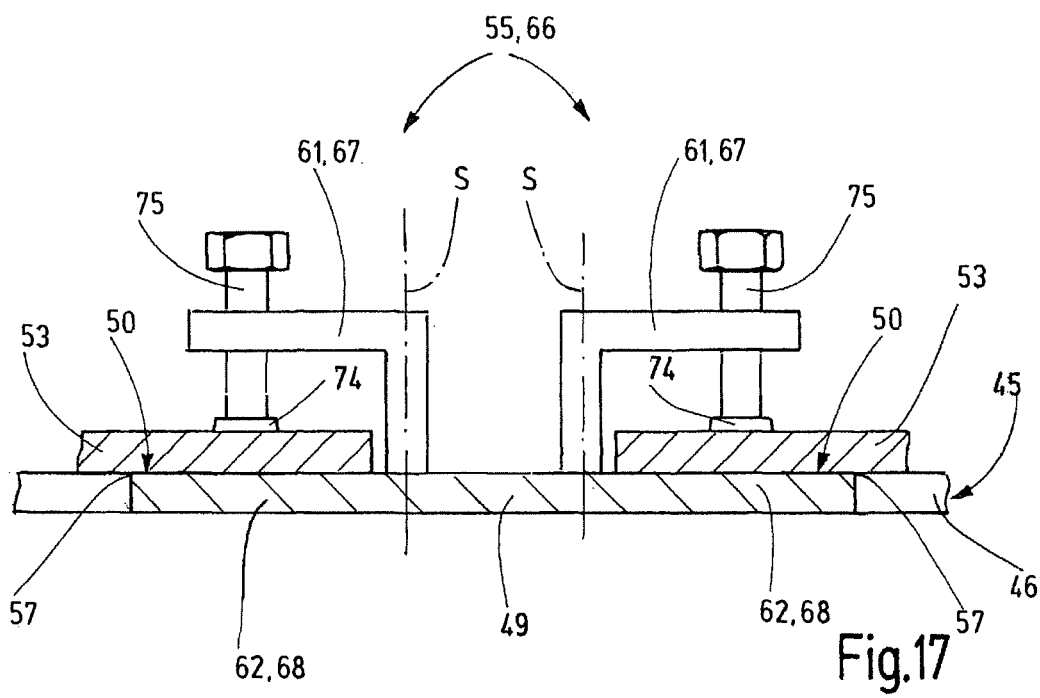

Another embodiment of a connection unit 55 configured as clamping unit 66 is illustrated in FIG. 16 that corresponds substantially to the embodiment of FIG. 14, wherein instead of an eccentric clamping means or eccentric clamping lever 71, a clamping body 74 is movably supported on the first clamping leg 67. The clamping body 74 can be moved toward the second clamping leg 68 or away from the second clamping leg 68, e.g. by means of a clamping screw 75 that is supported in an internal thread of the first clamping leg 67. The clamping body 74 can be supported on the cover 53 while a second clamping leg 68 is supported on the flange lower side 70 of the housing flange 38. Via clamping screw 75 the clamping force can be created by elastic deformation of the clamping bracket.

This embodiment of the clamping unit 66 according to FIG. 16 can be modified for the use in the area of the central web 49. Analog to the embodiments according to FIGS. 13 and 15, the second clamping bracket 68 is formed by the central web 49. Apart therefrom the embodiment according to FIG. 17 corresponds to the embodiment according to FIG. 16 such that reference can be made to the description above.

Figure 18:
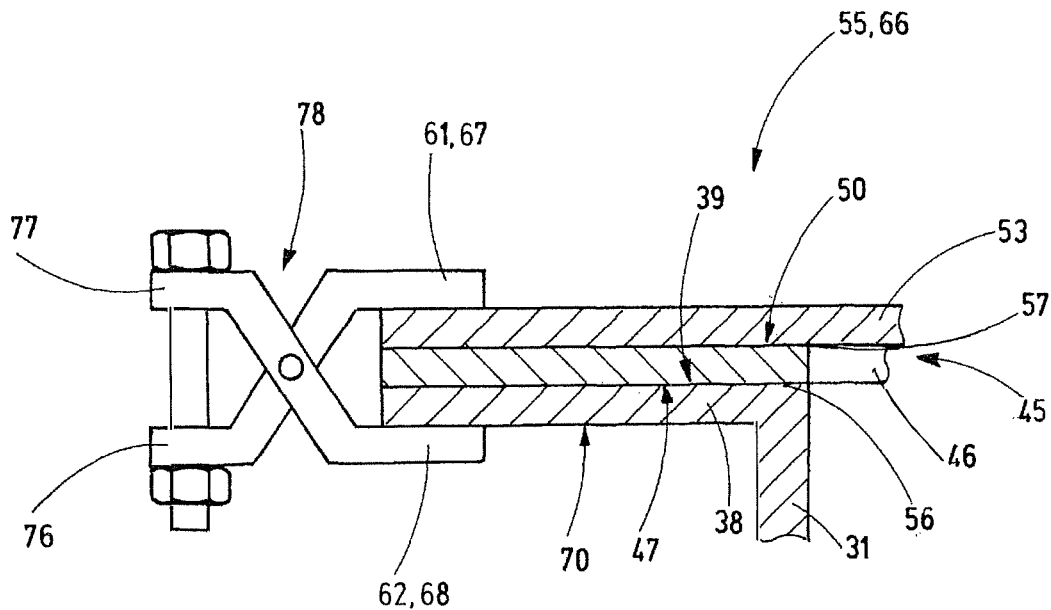
Figure 19:
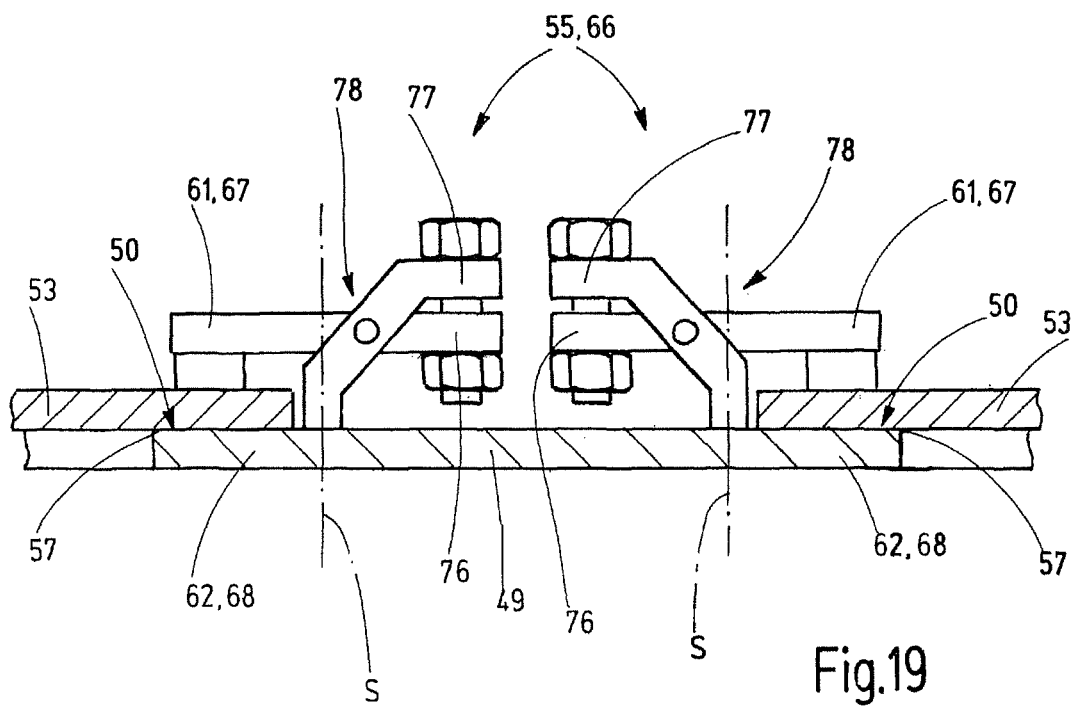

FIG. 18 shows another embodiment. Thereby the first connection part 61 is formed by the first clamping leg 67 and the second connection part 62 is formed by the second clamping leg 68. The first clamping leg 67 is connected with a first arm 76 via a connection piece and the second clamping leg 68 is connected with a second arm 77 via a connecting piece. The two connecting pieces are supported on one another in a hinged manner and form a scissors or forceps joint 78. The connection pieces cross each other and the first arm 76 is located approximately on the level of the second clamping leg 68 according to the example, whereas the second arm 77 is located approximately on the level of the first clamping leg 67. If the two arms 76, 77 are urged toward each other, this force is transmitted via the scissors or forceps joint 78 on the clamping legs 67, 68 and the later are also urged toward one another and can create a clamping effect. Dependent from the dimension and configuration of the scissors or forceps joint 78, thereby a forced transmission can be achieved. For example, the two arms 76, 77 can be tensioned against one another via a screw connection. Thus, the arrangement of the cover 53, the peripheral web 46 and the housing flange 38 can be clamped against one another between the two clamping legs 67, 68 in order to maintain the flameproof gaps 56, 57.

A similar slightly modified arrangement of the clamping unit 66 shown in FIG. 18 and described above can be used in the area of the central web 49, wherein also here again the second clamping leg 68 is formed by the central web 49. For reasons of required space a connection piece between the first clamping leg 67 and the first arm 76 can be omitted and the first arm 76 can linearly transition in the first clamping leg 67. Also in this arrangement according to FIG. 19, pivotability around a pivot axis S can be provided, wherein here the second arm 77 can be pivotably supported around the pivot axis S on the central web 49. The first arm 76 and the first clamping leg 67 are supported on the connection piece between the central web 49 and the second arm 77 via the scissors or forceps joint 78.

Further embodiments of connection units that can be used in the present invention are also described in the European application with the application number 18175982.0, which is in thus far incorporated by reference.

The assembly of the explosion-proof housing 30 including the arrangement of the at least one electrical and/or electronic device 37 in the interior 32 is explained in the following with reference to FIGS. 3-5:

First, the housing body 31 is provided. In the interior 32 of the housing body 31 the at least one ignition source and according to the example, the at least one electrical and/or electronic device 37 can be arranged. For this the whole area of the housing opening 36 is available first.

Subsequently, the frame abutment surface 47 of frame part 45 is brought in abutment with the housing abutment surface 39. Thus, the housing opening 36 is separated in multiple opening sections, due to the at least one central web 49 and according to the example, in a first opening section 36*a* and a second opening section 36*b*. Subsequently, the covers 53 are brought in abutment with the cover abutment surface 50. By means of the connection units 55 of the connection arrangement 54 then a releasable connection between the covers 53, the frame part 45 and the housing body 31 is established in a manner such that a first flameproof gap 56 is formed between the frame part 45 and the housing abutment surface 39 and a second flameproof gap 57 is formed between the covers 53 and the frame part 45. In doing so, the interior 32 is separated in an explosion-proof manner from the environment 35.

Due to the inventive configuration of the explosion-proof housing 30, the whole housing opening 36 is available for assembly of the at least one electrical and/or electronic device 37. Due to the subsequent arrangement of the frame part 45, the housing opening 36 is separated in individual opening sections, whereby multiple, separate covers 53 can be used, the covering surface of which are smaller than the housing opening 36 of the housing body 31. This simplifies the handling. However, by means of the separate frame part 45 releasably connected with the housing body 31, it is guaranteed that if necessary the total housing opening 36 can be made available for assembly actions.

The invention refers to an explosion-proof housing 30 comprising a housing body 31, a frame part 45 and at least two separate covers 53. The housing body 31 limits an interior 32 that is open at one side by a housing opening 36. The frame part has a peripheral web 46 that surrounds the housing opening 36. Within the peripheral web 46 a central web 49 of the frame part 45 extends that separates the housing opening 36 in at least two opening sections 36a, 36b. A cover abutment surface 50 is formed on the central web 49 and the peripheral web 46 against which the covers 53 abut in their closing position. A circumferentially closed flameproof gap 57 is formed between each cover 53 and the cover abutment surface 50, if the cover 53 is in the closing position and is releasably attached to the frame part 45 by means of at least one or multiple connection units 55. Preferably the at least one connection unit 55 also serves to attach the frame part 45 to the housing body 31 and to maintain thereby a flameproof gap 56 between the frame part 45 and the housing body 31.

LIST OF REFERENCE SIGNS 30 explosion-proof housing
31 housing
32 interior
33 housing wall
34 pressure-relief device
35 environment
36 housing opening
36a first opening section
36b second opening section
37 electrical and/or electronic device
38 housing flange
39 housing abutment surface
45 frame part
46 peripheral web
47 frame abutment surface
48 frame inner space
48a first space section
48b second space section
49 central web
50 cover abutment surface
53 cover
54 connection arrangement
55 connection unit
56 first flameproof gap
57 second flameproof gap
61 first connection part
62 second connection part
63 external thread part
64 internal thread part
65 internal thread bushing
66 clamping unit
67 first clamping leg
68 second clamping leg
69 wedge body
70 flange lower side
71 eccentric clamping lever
72 eccentric cam
73 cam surface
74 clamping body
75 clamping screw
76 first arm
77 second arm
78 scissors or forceps joint
E eccentric axis
S pivot axis

The invention claimed is:

1. An explosion-proof housing comprising:
a housing body that limits an interior and that comprises a housing opening via which access to the interior can be achieved, the housing body having a housing surface extending along a first plane;
a frame part separate from the housing body and having first and second frame part surfaces opposite one another, the first frame part surface facing the housing surface to form a first flameproof gap;
a peripheral web surrounding the housing opening and that comprises at least one central web that extends within the peripheral web and separates the housing opening in at least two opening sections; and
at least two separate covers each having a cover surface facing the second frame part surface to form a second flameproof gap.

2. The explosion-proof housing according to claim 1, wherein at least two of the provided covers abut against each central web, if the covers are in the closing position.

3. The explosion-proof housing according to claim 1, wherein the frame part is individual integrally configured.

4. The explosion-proof housing according to claim 1, wherein the housing body comprises a housing flange that surrounds the housing opening.

5. The explosion-proof housing according to claim 4, wherein the peripheral web abuts against the housing flange such that a third flameproof gap is formed between the peripheral web and the housing flange.

6. The explosion-proof housing according to claim 1, wherein the covers are releasably attached to the frame part and/or the housing body by means of a connection arrangement.

7. The explosion-proof housing according to claim 1, wherein the thickness of the at least one central web is larger than the thickness of the peripheral web.

8. An explosion-proof housing comprising:
a housing body that limits an interior and that comprises a housing opening via which access to the interior can be achieved,
a frame part that is attached to the housing body and that comprises a peripheral web surrounding the housing opening and that comprises at least one central web that extends within the peripheral web and separates the housing opening in at least two opening sections,
wherein the frame part is releasably attached to the housing body by a connection arrangement comprising multiple separate connection units wherein one or more of the connection units are configured as a clamping unit that is configured for creation of a clamping connection, and at least two separate covers that abut against the peripheral web and/or the at least one central web in a closing position respectively, such that between each cover and the frame part a flameproof gap is formed.

9. The explosion-proof housing according to claim 8, wherein the frame part and the covers are releasably attached to the housing body by means of the same connection arrangement.

10. The explosion-proof housing according to claim 8, wherein each connection unit comprises a first connection part and a second connection part cooperating with the first connection part.

11. The explosion-proof housing according to claim 10, wherein the second connection part of each connection unit is immovably connected with the housing body or the frame part.

12. The explosion-proof housing according to claim 10, wherein the first connection part is an external thread part and that the second connection part is an internal thread part.

13. A method for explosion-proof arrangement of at least one electrical and/or electronic device in an explosion-proof housing, the method comprising:

providing a housing body that limits an interior and that comprises a housing opening, the housing body having a housing surface extending along a first plane;

providing a frame part having first and second frame part surfaces opposite one another, the first frame part surface facing the housing surface to form a first flameproof gap;

a peripheral web that surrounds the housing opening and comprises at least one central web that extends within the peripheral web;

providing at least two separate covers each having a cover surface facing the second frame part surface;

arranging the at least one electrical and/or electronic device in the interior of the housing body; and attaching the frame part to the housing body in a manner such that the at least one central web separates the housing opening in at least two opening sections and attaching the at least two covers in a closing position to the frame part, wherein one cover surface faces the peripheral web and the other of the cover surfaces faces the at least one central web, such that a second flameproof gap is formed between each cover and the second frame part surface and wherein the frame part is releasably attached to the housing body by a connection arrangement.

* * * * *